(12) United States Patent
Kim et al.

(10) Patent No.: US 7,810,014 B2
(45) Date of Patent: Oct. 5, 2010

(54) APPARATUS AND METHOD FOR STOPPING ITERATIVE DECODING IN A MOBILE COMMUNICATION SYSTEM

(75) Inventors: Sang-Hyo Kim, Suwon-si (KR);
Young-Mo Gu, Suwon-si (KR);
Chang-Hyun Kwak, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1002 days.

(21) Appl. No.: 11/593,647

(22) Filed: Nov. 7, 2006

(65) Prior Publication Data
US 2007/0118790 A1 May 24, 2007

(30) Foreign Application Priority Data
Nov. 7, 2005 (KR) .................. 10-2005-0106207

(51) Int. Cl.
*H03M 13/15* (2006.01)
*H03M 13/29* (2006.01)
(52) U.S. Cl. ....................................... 714/758
(58) Field of Classification Search ................ 714/755, 714/758, 780
See application file for complete search history.

(56) References Cited

U.S. PATENT DOCUMENTS

| 5,983,382 | A | 11/1999 | Pauls | |
|---|---|---|---|---|
| 6,081,919 | A | 6/2000 | Fujiwara et al. | |
| 6,182,261 | B1 * | 1/2001 | Haller et al. | 714/758 |
| 6,526,531 | B1 * | 2/2003 | Wang | 714/704 |
| 6,591,390 | B1 * | 7/2003 | Yagyu | 714/755 |
| 6,629,287 | B1 | 9/2003 | Brink | |
| 7,051,268 | B1 * | 5/2006 | Sindhushayana et al. | 714/786 |
| 2004/0140915 | A1 | 7/2004 | Shen et al. | |

FOREIGN PATENT DOCUMENTS

| EP | 0643493 A1 | 3/1995 |
|---|---|---|
| EP | 1 418 697 A1 | 5/2004 |
| JP | 08-008898 | 1/1996 |
| JP | 10-190486 | 7/1998 |
| JP | 2003-179506 | 6/2003 |
| KR | 10-0499469 B1 | 10/2001 |
| KR | 10-2001-0099785 A | 11/2001 |

(Continued)

OTHER PUBLICATIONS

Ambroze et al., "Practical Aspects of Iterative Decoding", IEEE Proceedings: Communications, Institution of Electrical Engineers, GB, Apr. 14, 2000, pp. 69-74, vol. 147, No. 2, IEEE, XP006013962.

(Continued)

*Primary Examiner*—Stephen M Baker
(74) *Attorney, Agent, or Firm*—Roylance, Abrams, Berdo and Goodman, LLP (57) ABSTRACT

An apparatus and method are provided for stopping iterative decoding in a channel decoder of a mobile communication system. Constituent decoding of received signals is performed and decoded signals are output. Hard decision processes for the decoded signals are performed and hard-decided signals are output. The hard-decided signals are cyclic redundancy check (CRC) encoded, and a determination is made as to whether the parities are identical and iterative decoding is stopped according to a determination result.

17 Claims, 8 Drawing Sheets

FOREIGN PATENT DOCUMENTS

KR    10-2005-0046302 A    5/2005

OTHER PUBLICATIONS

Shao et al., "Two Simple Stopping Criteria For Turbo Decoding", IEEE Transactions on Communications, Aug. 1999, pp. 1117-1120, vol. 47, No. 8, IEEE Service Center, Piscataway, New Jersey, USA, XP011009477.

Peterson et al., "Cyclic Codes For Error Detection", Proceedings of the Institute of Radio Engineers, Jan. 1961, pp. 228-235, vol. 49, No. 1, IEEE Inc., New York, USA, XP000760405.

* cited by examiner

APPARATUS AND METHOD FOR STOPPING ITERATIVE DECODING IN A MOBILE COMMUNICATION SYSTEM

CROSS-REFERENCE TO RELATED APPLICATIONS

This application claims the benefit under 35 U.S.C. §119 (a) of Korean Patent Application No. 10-2005-0106207, entitled "Apparatus and Method for Stopping Iterative Decoding in a Mobile Communication System", filed Nov. 7, 2005 in the Korean Intellectual Property Office, the entire disclosure of which is incorporated herein by reference.

BACKGROUND OF THE INVENTION

1. Field of the Invention

The present invention relates generally to an apparatus and method for stopping iterative decoding. More particularly, the present invention relates to an apparatus and method for stopping iterative decoding using a cyclic redundancy check (CRC) in a mobile communication system.

2. Description of the Related Art

Mobile communication systems use an encoder and a decoder to correct errors of a forward channel. In such mobile communication systems, data transmission and reception are performed in a wireless environment. In order to effectively correct errors related to noise occurring in a transmission channel and improve the reliability of data transmission, convolutional codes corresponding to trellis codes, and Reed-Solomon (RS) codes corresponding to linear block codes, are typically used. In 1993, Berrou et al. introduced an iterative decoding method and turbo codes exhibiting error correction capability that can approach the theoretical Shannon limit. In a synchronous system of the $3^{rd}$ generation partnership project 2 (3GPP2) and an asynchronous system of the $3^{rd}$ generation partnership project (3GPP) serving as $3^{rd}$ mobile communication systems, turbo codes have been adopted as error correction codes. The turbo codes ensure higher communication reliability than conventionally used convolutional codes.

Figure 1:
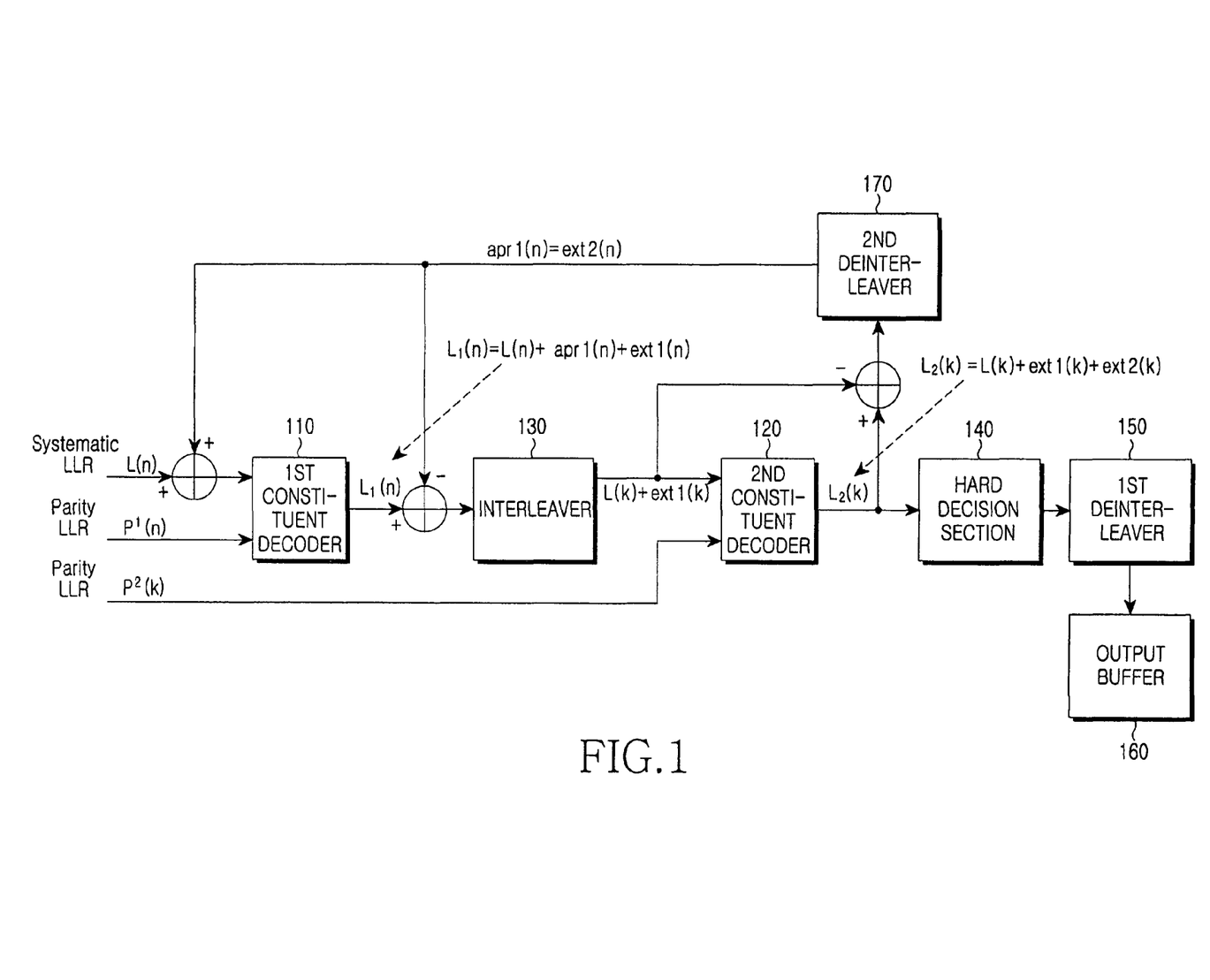
FIG. 1 is a block diagram illustrating a conventional turbo decoder.

FIG. 1 illustrates a structure of a conventional turbo decoder. A turbo encoder is provided with two convolutional encoders that are connected parallel to each other. Thus, an interleaver 130 is connected between two constituent decoders 110 and 120 as decoders for two constituent codes. The first constituent decoder 110 receives L(n) representing a log likelihood ratio (LLR) of input information bits and $P^1(n)$ representing an LLR of parity bits mapped to the first constituent decoder 110 and then outputs $L_1(n)$.

In an iterative decoding process, prior information apr1($n$) is added to the L(n) input at an adder prior to the first constituent decoder, and the sum is then input to the first constituent decoder 110. Herein, the prior information apr1($n$) is a log ratio between probabilities that an arbitrary information symbol has values of 0 and 1 before an encoding process. In the general encoding theory, it is assumed that the probability of an information symbol of 0 is equal to that of an information symbol of 1. The first prior information apr1($n$) has a constant value of 0. However, while the turbo decoder performs the iterative decoding process, external information obtained from one constituent decoder of the turbo decoder is used as prior information for an information symbol to be decoded by the other constituent decoder, such that the prior information apr1($n$) no longer has the constant value of 0.

In the first decoding process, apr1($n$) becomes 0. The output $L_1(n)$ is a soft output LLR related to information bits of the first constituent decoder 110 and is a sum of the input prior information apr1($n$), the information bit LLR L(n) and external information ext1($n$) added in the decoding process of the first constituent decoder 110. For the decoding process of the second constituent decoder 120, the prior information apr1($n$) is subtracted from the output $L_1(n)$ at an adder between the first constituent decoder and the interleaver, and the interleaver 130 then performs an interleaving process on the result. Herein, an interleaved sequence is denoted by L(k) using an index k.

The interleaver 130 performs an operation for interleaving a sequence of data such that an output of the first constituent decoder 110 is proper as an input of the second constituent decoder 120 by considering data interleaved between constituent encoders for configuring turbo codes. The second constituent decoder 120 receives an interleaved sequence L(k)+ext1($k$) and a parity bit LLR $P^2(k)$, and outputs a soft output LLR $L_2(k)$ of interleaved information bits.

Then, ext(k), computed by subtracting input prior information L(k) of the second constituent decoder 120 from the output $L_2(k)$ of the second constituent decoder 120 at an adder between the first and second constituent decoders, is input to the first constituent decoder 110 through a second deinterleaver 170. At this time, a deinterleaved sequence of ext2($k$) becomes ext2($n$)=apr1($n$).

Accordingly, the first constituent decoder 110 receives the feedback of the prior information apr1($n$) from the second constituent decoder 120. The first constituent decoder 110 receives and re-decodes the prior information, the information bits and the parity bits. When the above-described series of processes are repeated, an output LLR related to information bits is improved and a decoding process having a performance approaching the Shannon limit is possible.

The structure of FIG. 1 uses the two constituent decoders 110 and 120. However, when one encoded frame is decoded, the first and second constituent decoders 110 and 120 do not simultaneously operate, and the first and second constituent decoders can be reused in the same hardware since they each have the same structure.

Conventionally, $L_2(k)$ is a final output LLR after designated iterative decoding. When this information is deinterleaved in a first deinterleaver 150 after a hard decision process in a hard decision section 140 and is accumulated in an output buffer 160, the decoding process is completed.

However, the turbo codes are constructed in the form of parallel-concatenated convolutional codes in which two recursive systematic convolutional codes are concatenated. When the parallel-concatenated convolutional codes are decoded, one decoding process in which decoding of respective constituent codes is combined is completed. When this decoding process is repeated many times, a decoding performance approaching the Shannon limit can be obtained.

After the discovery of the turbo codes, many codes have been introduced which can obtain a decoding performance approaching the Shannon limit through iterative decoding of serially concatenated convolutional codes, parallel-concatenated block codes, low density parity check (LDPC) codes, repeat accumulate (RA) codes, zigzag codes, and so forth. When the decoder performs an iterative decoding process for codes, there are methods that are capable of stopping the decoding process if the iteration is no longer needed after a sufficient number of iterations.

In the case of LDPC codes, an iterative decoding process is performed using a sum-product algorithm on the basis of a parity check matrix. In the sum-product algorithm, a codeword is identified by parity check at every iterative decoding and the iterative decoding can be stopped. That is, because the sum-product algorithm of the decoding method can identify a codeword in the case of the LDPC codes, stopping criteria can be provided.

In the case of turbo codes of 3GPP2, a cyclic redundancy check (CRC) code is attached to the end of all turbo-coded packets. In an iterative decoding process, a CRC is performed for every hard-decided data. The iterative decoding process is stopped only upon determining that the data is suitable in the CRC.

In the case of turbo codes of 3GPP, Institute of Electrical and Electronics Engineers (IEEE) 802.16, and so forth, a CRC cannot be performed in stopping the iterative decoding process because a CRC region is absent in every frame. Thus, a process for stopping iterative decoding of the turbo codes without additional information uses a hard decision-aided (HDA) method, a cross entropy (CE) method, a method for stopping iterative decoding using a main value such as a minimal value of an LLR during an iterative decoding process for the turbo codes, and so forth.

Among the well-known methods for stopping iterative decoding, the HDA method is superior because the degradation of decoding performance is almost absent and very fast stopping is possible. The CE method needs very complex computations and hardware in actual implementation, and the method using a minimal value of an LLR is inefficient and degrades the performance when automatic gain control is not precise.

Criteria for judging the performance of an iterative decoding stopping scheme include a measurement of performance difference when a predefined maximal iterative decoding process is performed, the average number of iterative decoding processes in a given signal to noise ratio, and so forth. It is preferred that a decoding performance difference is almost absent and that the average number of iterative decoding processes is close to the theoretical limit.

In the iterative decoding stopping scheme, the theoretical limit of the average number of iterative decoding processes is based on a Genie-aided stopping scheme. This scheme stops the iteration when a message to be decoded is equal to a message to be received under an assumption that a receiver already knows the message to be decoded. Because the scheme stops the iteration when data is normally decoded, performance degradation is never present and the average number of iterative decoding processes is minimal. However, the Genie-aided stopping scheme is theoretical, and cannot be actually implemented because the receiver of a communication system cannot know transmitted data. Because the scheme is theoretically an optimal means, it is used as a reference for comparisons between iterative decoding stopping schemes.

In the iterative decoding process for turbo codes, the HDA method stores hard-decided data in each decoding step and compares the stored data with a result of the next decoding step. The HDA method does not affect the decoding performance and is a superior decoding method approaching the theoretical minimum value. In order to implement the HDA method, the decoding process should store information computed by performing a hard decision process for a decoding output of the prior step. Accordingly, the HDA method requires a memory with a size equal to that of the associated information bit length. Further, the HDA method has problems in regard to hardware complexity. These problems will be described in greater detail with reference to FIG. 2.

Figure 2:
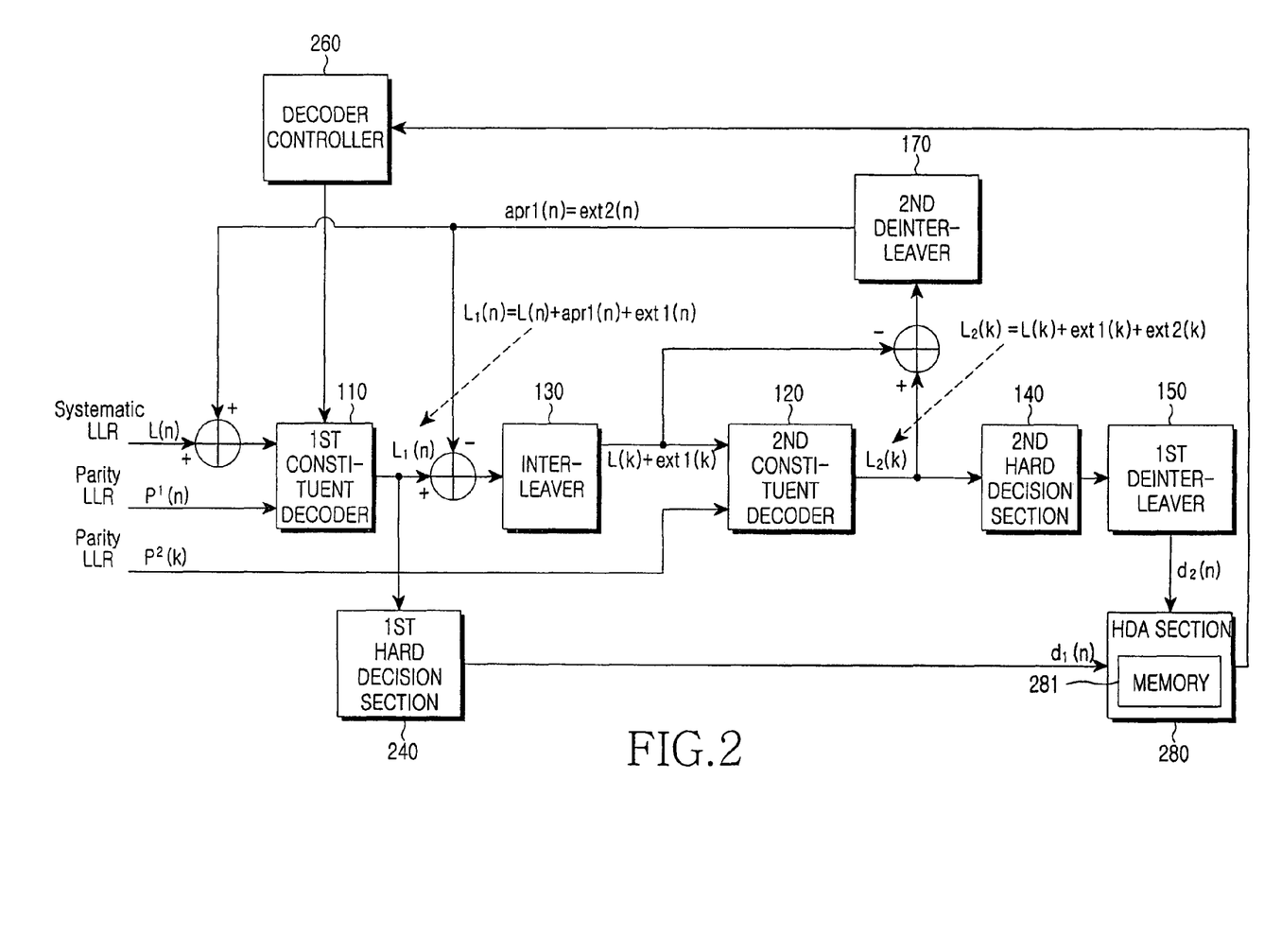
FIG. 2 is a block diagram illustrating a turbo decoder using a conventional hard decision-aided (HDA) method.

FIG. 2 is a block diagram illustrating a turbo decoder using the HDA method for iterative decoding of turbo codes. In FIGS. 1 and 2, like reference numerals will be understood to refer to like parts, components and structures, and further description thereof is omitted for clarity and conciseness. In FIG. 2, hard decision results of soft outputs $L_1(n)$ and $L_2(k)$ from constituent decoders are used as criteria for stopping iterative decoding of the turbo decoder. An exemplary operation of the turbo decoder of FIG. 2 is as follows.

In order to stop iterative decoding using the HDA stopping method, an HDA section 280 uses $d_1(n)$ computed by performing a first hard decision process of a first hard decision section 240 for the output $L_1(n)$ of the first constituent decoder 110, and $d_2(n)$ computed by performing a second hard decision process of the (second) hard decision section 140 for the result of the interleaving process for the output $L_2(k)$ of the second constituent decoder 120.

The HDA section 280 receives $d_1(n)$ and $d_2(n)$ in every constituent decoding. The HDA section 280 stores previously received hard decision information and then outputs a stop signal to a decoder controller 260 if all N inputs including the current input are identical. In response to the stop signal, the decoder controller 260 stops iterative decoding. Herein, the HDA method for stopping iterative decoding when all N decoding frames are identical is referred to as the "N-HDA stopping method".

The HDA stopping method is superior because performance degradation of the decoder due to the processes for stopping iterative decoding is almost absent, and very fast stopping is possible. However, when a maximal frame size is L bits in the HDA section 280 of FIG. 2, a memory 281 of size NL or (N−1)L bits is required in the case of the N-HDA stopping method.

That is, in the iterative decoding process for turbo codes, the HDA method stores hard-decided data in each decoding step and compares the stored data with a result of the next decoding step. The HDA method does not affect the decoding performance and is a superior decoding method approaching the theoretical minimum value. In order to implement the HDA method, the decoding process should store information computed by performing a hard decision process for a decoding output of the prior step. To do so, the HDA method requires the memory 281 with a size equal to that of the associated information bit length and further has problems in regard to hardware complexity.

Accordingly, a need exists for an improved system and method for efficiently and effectively stopping iterative decoding of turbo codes in a mobile communication system.

SUMMARY OF THE INVENTION

It is, therefore, an object of embodiments of the present invention to substantially solve the above and other problems, and provide an apparatus and method that can efficiently and effectively stop iterative decoding of turbo codes in a mobile communication system.

It is another object of embodiments of the present invention to provide an apparatus and method for stopping iterative decoding that can reduce hardware complexity in implementing a hard decision-aided (HDA) method for stopping iterative decoding of turbo codes in a mobile communication system.

It is yet another object of embodiments of the present invention to provide an apparatus and method for stopping iterative decoding that can minimize required memory capacity using a cyclic redundancy check (CRC) when implementing a scheme for stopping iterative decoding of the turbo codes in a mobile communication system.

In accordance with an aspect of embodiments of the present invention, an apparatus for stopping iterative decoding in a mobile communication system is provided, comprising one or more constituent decoders for performing constituent decoding of received signals and outputting constituent decoding results, hard decision sections for performing hard decision processes for outputs of the one or more constituent decoders and outputting hard decision results, one or more cyclic redundancy check (CRC) encoders for CRC encoding outputs of the hard decision sections and outputting parities, and a stop condition determination section for determining whether to stop iterative decoding according to whether the parities output from the one or more CRC encoders are identical.

In accordance with another aspect of embodiments of the present invention, a method for stopping iterative decoding in a mobile communication system is provided, comprising performing constituent decoding of received signals and outputting decoded signals, performing hard decision processes for the decoded signals and outputting hard-decided signals, cyclic redundancy check (CRC) encoding the hard-decided signals and outputting parities, and determining whether the parities are identical and stopping iterative decoding according to a determination result.

In accordance with yet another aspect of embodiments of the present invention, a method for stopping iterative decoding in a mobile communication system is provided, comprising performing constituent decoding of received signals and outputting decoded signals, performing hard decision processes for the decoded signals and outputting hard-decided signals, cyclic redundancy check (CRC) encoding the hard-decided signals and outputting parities, determining whether the number of constituent decoding processes is even, and determining whether the parities are identical when the number of constituent decoding processes is even and stopping iterative decoding according to a determination result.

In accordance with yet another aspect of embodiments of the present invention, a method for stopping iterative decoding in a mobile communication system is provided, comprising performing constituent decoding of received signals and outputting decoded signals, performing hard decision processes for the decoded signals and outputting hard-decided signals, cyclic redundancy check (CRC) encoding the hard-decided signals and outputting parities, determining whether the number of constituent decoding processes is odd, and determining whether the parities are identical when the number of constituent decoding processes is odd and stopping iterative decoding according to a determination result.

BRIEF DESCRIPTION OF THE DRAWINGS

The above and other objects, features and advantages of embodiments of the present invention will become more clearly understood from the following detailed description taken in conjunction with the accompanying drawings, in which.

Throughout the drawings, like reference numerals will be understood to refer to like parts, components and structures.

DETAILED DESCRIPTION OF EXEMPLARY EMBODIMENTS

In the following description, detailed descriptions of functions and configurations incorporated herein that are well known to those skilled in the art are omitted for clarity and conciseness. It is to be understood that the phraseology and terminology employed herein is for the purpose of description and should not be regarded as limiting the present invention.

Embodiments of the present invention use a hard decision-aided (HDA) method for iterative decoding of turbo codes and minimize a memory needed for the HDA method using cyclic redundancy check (CRC) encoding.

The CRC is conventionally used to check a frame state and to determine whether a frame is appropriate. However, embodiments of the present invention use the CRC to determine whether hard decision results are identical during HDA iterative decoding. When the number of CRC bits is appropriately large, a probability of the same CRC encoding result between different original sequences is very low. Thus, an HDA decision using a CRC can be obtained with sufficient reliability.

Figure 3:
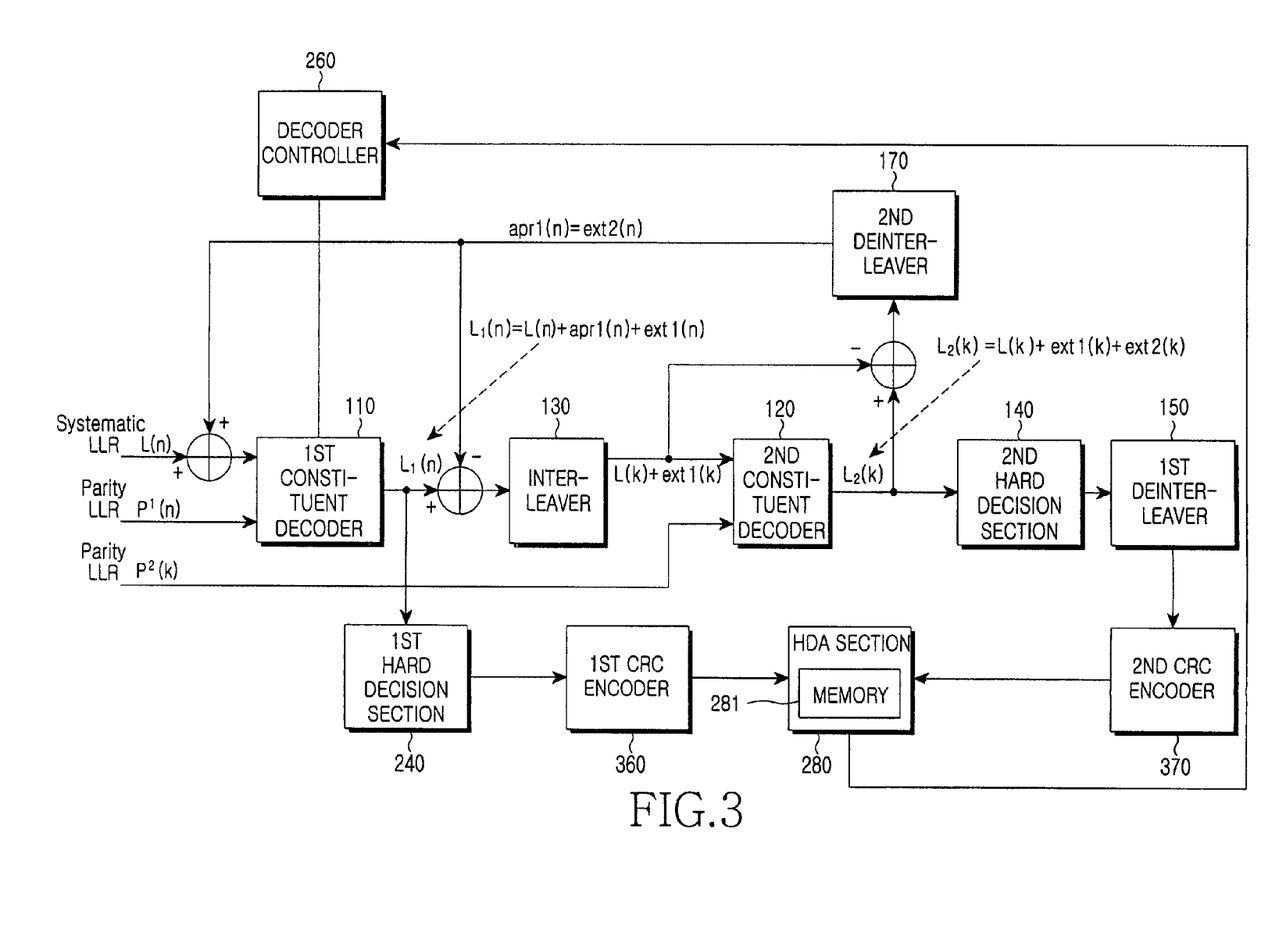
FIG. 3 is a block diagram illustrating a turbo decoder using the HDA method based on a cyclic redundancy check (CRC) in accordance with an exemplary embodiment of the present invention.

FIG. 3 is a block diagram illustrating a turbo decoder using an HDA stopping method based on a CRC in accordance with an exemplary embodiment of the present invention. In FIGS. 1, 2 and 3, the same components are denoted by the same reference numerals and further descriptions thereof are omitted for clarity and conciseness.

A soft output $L_1(n)$ of the first constituent decoder 110 is hard-decided in the first hard decision section 240 and is then CRC-encoded in a first CRC encoder 360.

A soft output $L_2(k)$ of the second constituent decoder 120 is hard-decided in the second hard decision section 140 and is then deinterleaved in the first deinterleaver 150. A deinterleaving result is then input to a second CRC encoder 370. Then, the second CRC encoder 370 performs a CRC encoding process.

Encoding results of the first and second CRC encoders 360 and 370 are output to the HDA section 280. The HDA section 280 uses the encoding results to determine whether hard decision results are identical during HDA iterative decoding. When the number of CRC bits is appropriately large, a probability of the same CRC encoding result between different original sequences is very low. Thus, an HDA decision using a CRC can be obtained with sufficient reliability. Herein, it is understood that an exemplary "stop condition determination section" in accordance with an embodiment of the present invention has substantially the same structure as the HDA section 280, but includes the ability to reach an HDA decision using encoding results of the first and second CRC encoders 360 and 370.

The HDA section 280 receives CRC encoding results R(i) computed by CRC encoding hard-decided information in every constituent decoding. Herein, it is assumed that i is an increment value in each constituent decoding. For example, when a 16-bit CRC is used, R(i) becomes 16 bits. When an N-HDA stopping method and a 16-bit CRC are used, a minimum memory size of only 16*(N−1) bits is required for the HDA stopping process.

Figure 4:
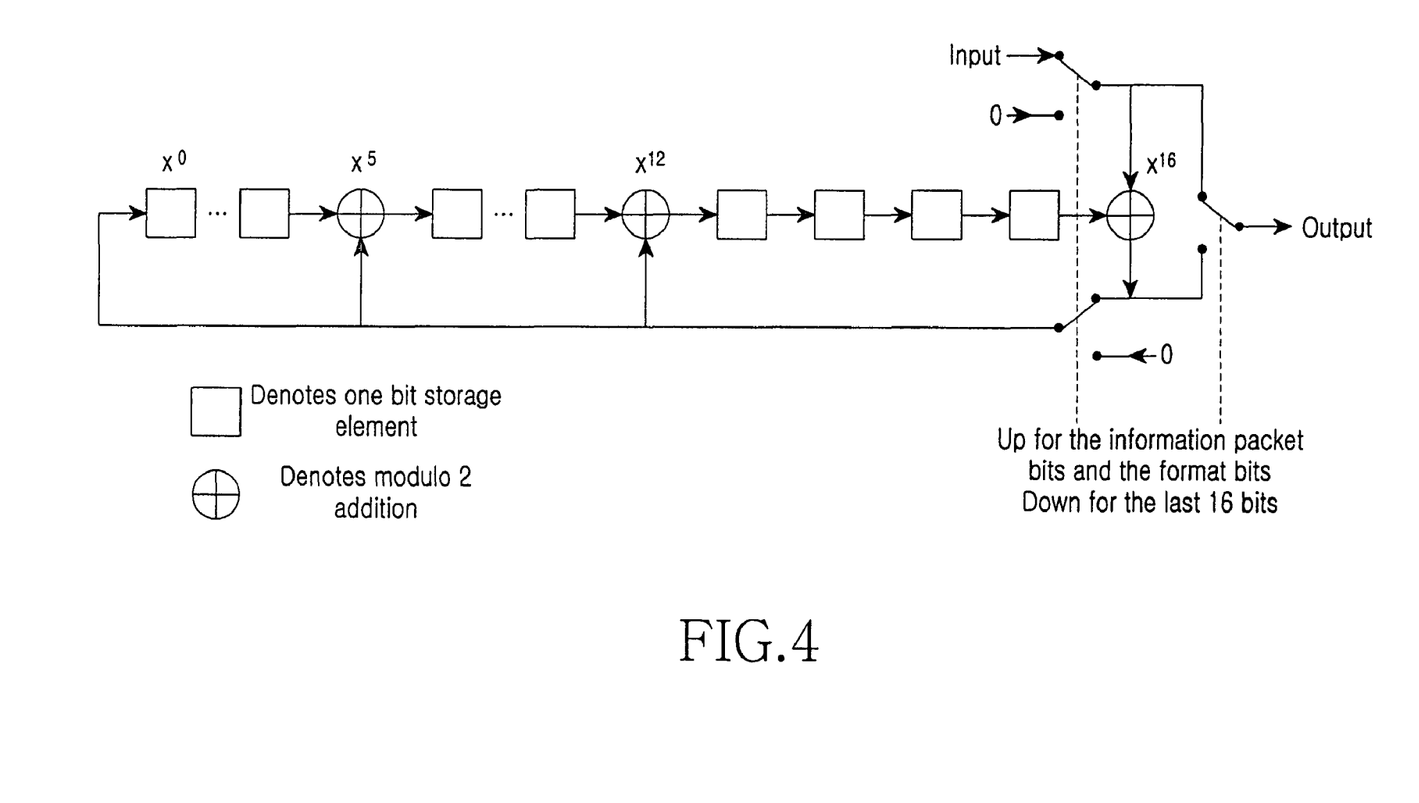
FIG. 4 is a block diagram illustrating a CRC encoder in accordance with an exemplary embodiment of the present invention.

FIG. 4 is a block diagram illustrating a CRC encoder of FIG. 3 in accordance with an exemplary embodiment of the present invention. Referring to FIGS. 3 and 4, the CRC encoders 360 and 370 can have a size of 16 bits, respectively, and use the CRC-16-CCITT (International Consultative Committee for Telegraphy and Telephony) defined in the International Telecommunication Union-Radio Communication Sector (ITU-R) Recommendation X.25.

The CRC encoders 360 and 370 can have a generation polynomial as shown in Equation (1) below, $$x^{16}+x^{12}+x^{5}+1 \tag{1}$$

and can be implemented with 16 shift registers, respectively, as illustrated in FIG. 4. After all the registers are set to 1, an input is provided according to a system clock. After the last input, a final register state becomes a CRC encoding result. FIG. 4 illustrates one example of a CRC encoder that can be used in embodiments of the present invention, however, any number or combinations of other CRC encoders can be used to implement this or other embodiments of the present invention.

Figure 5:
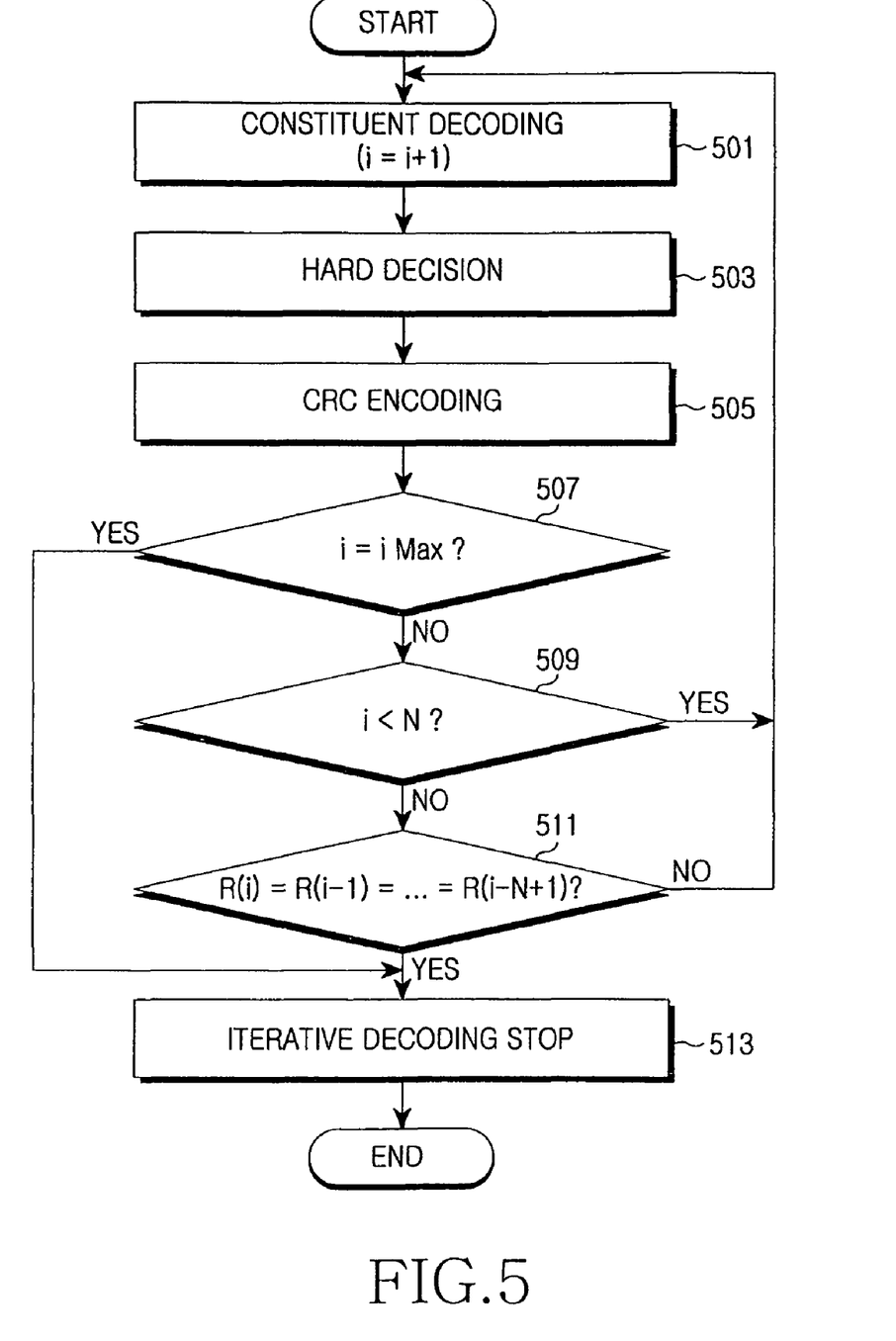
FIG. 5 is a flowchart illustrating a control operation of a turbo decoder when iterative decoding is stopped in a mobile communication system in accordance with an exemplary embodiment of the present invention.

FIG. 5 is a flowchart illustrating a control operation of a turbo decoder when iterative decoding is stopped using a CRC in a mobile communication system in accordance with an exemplary embodiment of the present invention.

Referring to FIG. 5, the first and second constituent decoders 110 and 120 decode received signals in step 501. An index i denotes the number of constituent decoding processes, and iMax denotes the maximum number of iterative constituent decoding processes. When the turbo decoder performs the maximum number Nmax of iterative decoding processes, iMax=2Nmax.

After each constituent decoding is performed, the first and second hard decision sections 140 and 140 perform hard decision processes in step 503. The first and second CRC encoders 360 and 370 then perform CRC encoding, and CRC encoding results R(i) are output to the HDA section 280 in step 505. The HDA section 280 then determines whether the number i of constituent decoding processes has reached the maximum number iMax of iterative constituent decoding processes in step 507.

If the number i of constituent decoding processes has reached the maximum number iMax of iterative constituent decoding processes, the HDA section 280 proceeds to step 513 to stop iterative decoding. However, if the number i of constituent decoding processes has not reached the maximum number iMax of iterative constituent decoding processes, the HDA section 280 then determines whether the number i of constituent decoding processes is less than the number N of iterations in step 509.

If the number i of constituent decoding processes is less than the number N of iterations, the method returns to step 501 such that constituent decoding is continuously performed. However, if the number i of constituent decoding processes is equal to or greater than the number N of iterations or if an N-HDA stopping process is performed, then HDA-CRC is performed. That is, a determination is made as to whether the iterative decoding is to be stopped using CRC encoding results. The HDA section 280 compares a CRC encoded result R(i) with N−1 previous successive CRC results in step 511. When the encoded result R(i) is equal to all of the N−1 previous successive CRC results, the HDA section 280 proceeds to step 513 to stop the iterative decoding. However, when the encoded result R(i) is different from any of the N−1 previous successive CRC results, the HDA section 280 returns to step 501 to continuously perform constituent decoding.

Figure 6:
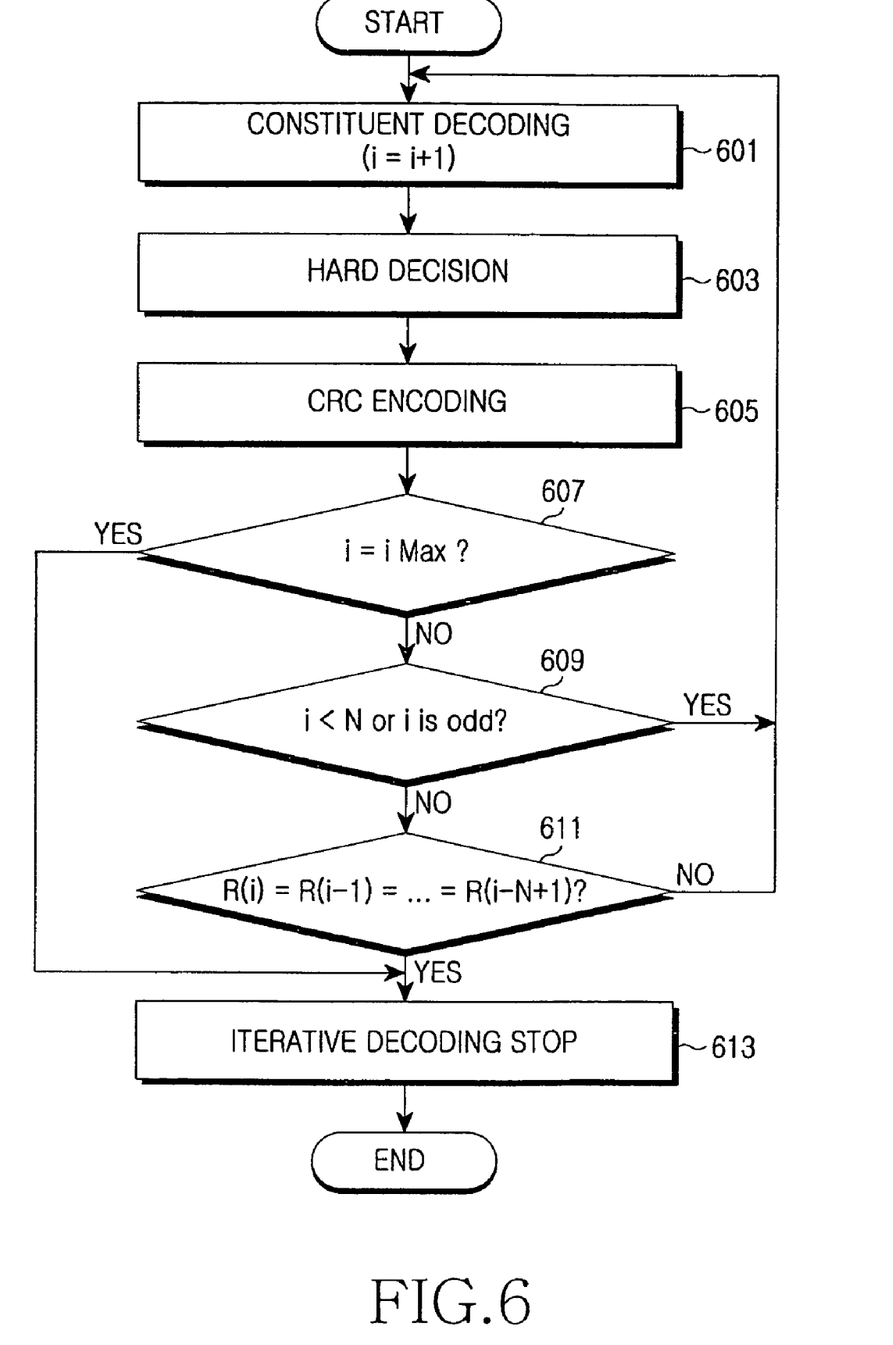
FIG. 6 is a flowchart illustrating a control operation of the turbo decoder when iterative decoding is stopped in the mobile communication system in accordance with another exemplary embodiment of the present invention.

FIG. 6 is a flowchart illustrating a control operation of the turbo decoder when iterative decoding is stopped in the mobile communication system in accordance with another exemplary embodiment of the present invention. In FIG. 6, another example of the HDA stopping method using a CRC will be described.

In the method of FIG. 6, the turbo decoder can perform two constituent decoding operations in one decoding process and stop decoding only in even constituent decoding. FIG. 6 is a flowchart illustrating the case where iterative decoding is stopped only in even constituent decoding. Alternatively, it should be noted that in other embodiments, the method of FIG. 6 can be provided in substantially the same manner for stopping iterative decoding only in odd constituent decoding.

The first and second constituent decoders 110 and 120 decode received signals in step 601. An index i denotes the number of constituent decoding processes, and iMax denotes the maximum number of iterative constituent decoding processes. When the turbo decoder performs the maximum number Nmax of iterative decoding processes, iMax=2Nmax. After each constituent decoding is performed, the first and second hard decision sections 240 and 140 perform hard decision processes in step 603.

The first and second CRC encoders 360 and 370 perform CRC encoding, and CRC encoding results R(i) are output to the HDA section 280 in step 605.

The HDA section 280 then determines whether the number i of constituent decoding processes has reached the maximum number iMax of iterative constituent decoding processes in step 607.

If the number i of constituent decoding processes has reached the maximum number iMax of iterative constituent decoding processes, the HDA section 280 proceeds to step 613 to stop iterative decoding. However, if the number i of constituent decoding processes has not reached the maximum number iMax of iterative constituent decoding processes, the HDA section 280 determines whether the number i of constituent decoding processes is less than the number N of iterations, or if the number i of constituent decoding processes is odd, in step 609.

If the number i of constituent decoding processes is less than the number N of iterations, or if the number i of constituent decoding processes (that is, the received encoding result R(i)) is odd, the HDA section 280 returns to step 601. However, if the number i of constituent decoding processes is equal to or greater than the number N of iterations, or if the number i of constituent decoding processes (that is, received encoding result R(i)) is even, the HDA section 280 compares the CRC encoded result R(i) with (N−1) previous successive CRC results and determines whether the CRC encoded result R(i) is equal to all of the (N−1) previous successive CRC results in step 611. When the encoded result R(i) is equal to all of the (N−1) previous successive CRC results, the HDA section 280 proceeds to step 613 to stop the iterative decoding. However, when the encoded result R(i) is different from any of the (N−1) previous successive CRC results, the HDA section 280 returns to step 601 to continuously perform constituent decoding.

Where the method of FIG. 6 is provided for stopping iterative decoding only in odd constituent decoding, step 607 can be modified to determine whether the number i of constituent decoding processes is less than the number N of iterations, or if the number i of constituent decoding processes is even.

Figure 7:
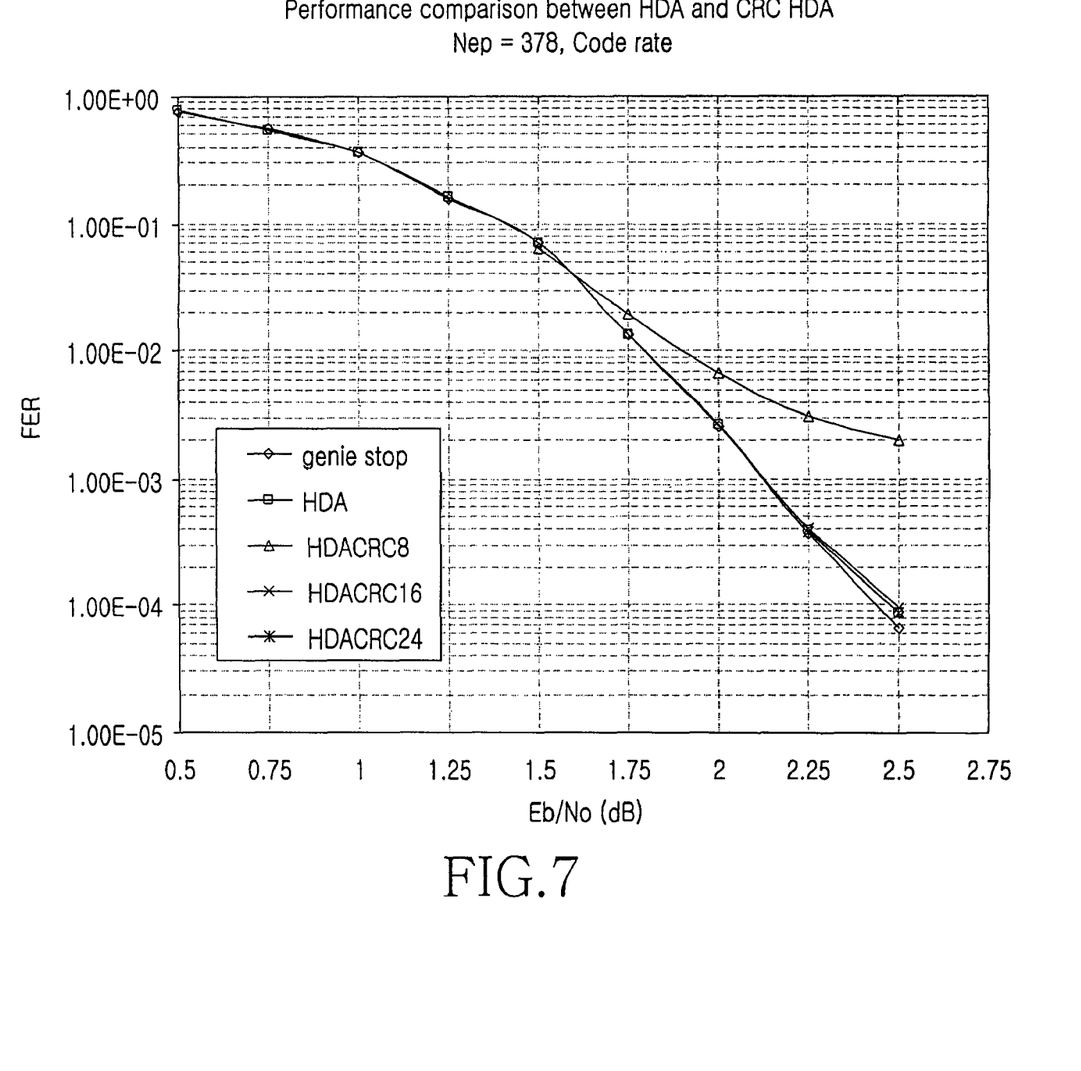
FIG. 7 is a graph illustrating a performance comparison between a method for stopping iterative decoding using a CRC in accordance with an exemplary embodiment of the present invention, and other methods.

FIG. 7 is a graph illustrating a performance comparison between a method for stopping iterative decoding using a CRC in accordance with an exemplary embodiment of the present invention, and other methods.

FIG. 7 illustrates the performance comparison between an exemplary method for stopping iterative decoding using a CRC in which N=2 and iterative decoding is stopped only when i is even, a conventional HDA stopping method in which N=2, and a theoretical Genie-aided stopping method that is incapable of actually being implemented.

FIG. 7 illustrates the decoding performance according to frame error rate (FER) along the vertical axis and Energy per bit per noise power spectral density (Eb/No) along the horizontal axis, and illustrates the decoding performance when 8-bit, 16-bit and 24-bit CRCs are used. When the 16-bit CRC is used, the proposed method has substantially the same performance as the conventional HDA method until reaching $FER=10^{-4}$ as illustrated in FIG. 7. When the 8-bit CRC is used, an error floor phenomenon appears from $FER=10^{-2}$.

Figure 8:
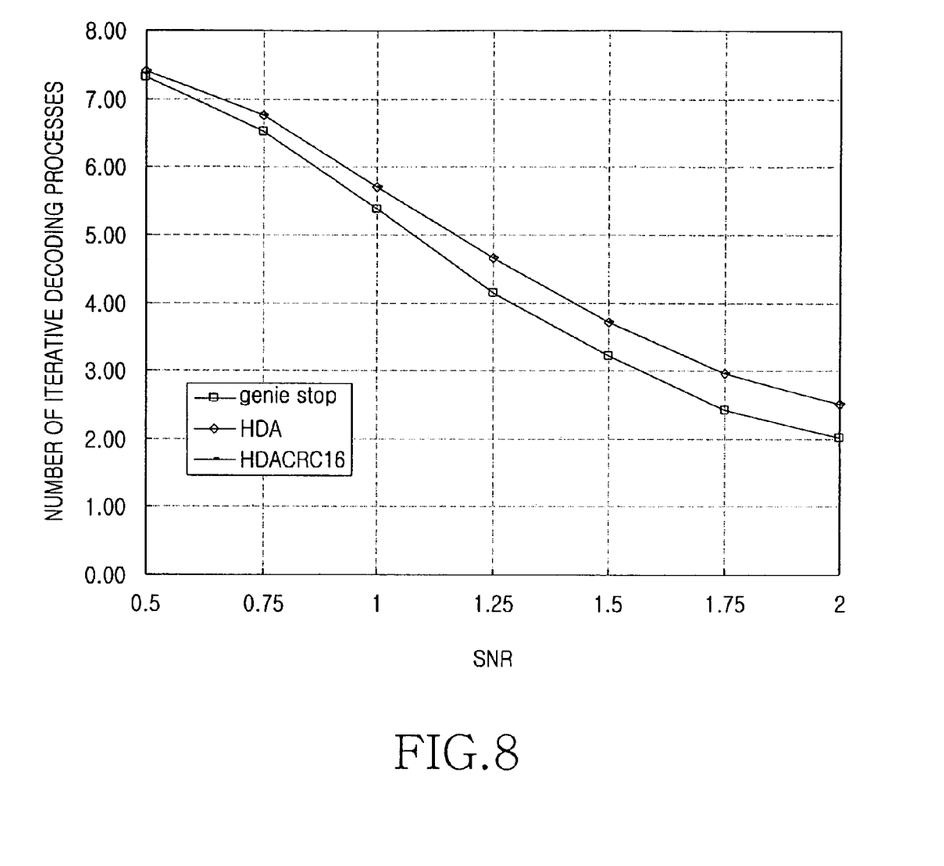
FIG. 8 is a graph illustrating a comparison of an average number of iterative decoding processes between a method for stopping iterative decoding using a CRC in accordance with an exemplary embodiment of the present invention, and another method.

FIG. 8 is a graph illustrating a comparison of an average number of iterative decoding processes between a method for stopping iterative decoding using a CRC in accordance with an exemplary embodiment of the present invention, and another method.

FIG. 8 illustrates the stopping performance comparison between the theoretical Genie-aided stopping method and an exemplary HDA stopping method using a CRC in which N=2 and iterative decoding is stopped only when i is even. FIG. 8 illustrates the number of iterative decoding processes along the vertical axis, according to signal to noise ratio (SNR) along the horizontal axis. The iterative decoding performance can be seen from FIG. 8. The method in accordance with embodiments of the present invention has a superior performance with the number of iterative decoding processes thereof only 0.5 more than that of the Genie-aided stopping method having a theoretical limit. Further, the proposed method has substantially the same stopping performance as the conventional HDA method.

Embodiments of the present invention can be realized in a number of ways, including computer-readable code written on computer-readable recording medium. The computer-readable recording medium can be any type of recording device in which data is stored in a computer-readable manner. Examples of the computer-readable recording medium include, but are not limited to, ROM, RAM, CD-ROM, magnetic tape, floppy disc, optical data storage, and carrier wave (e.g., data transmission through the Internet). The computer-readable recording medium can be distributed over a plurality of computer systems connected to a network so that computer-readable code is written thereto and executed therefrom in a decentralised manner. Further, functional programs, code, and code segments needed for realising embodiments of the present invention can be easily construed by one of ordinary skill in the art.

As is apparent from the above description, embodiments of the present invention provide a number of benefits, including the following effects.

The present invention uses CRC encoding to implement a very effective HDA stopping method in iterative decoding of turbo codes. When the frame length is L, an N-HDA stopping method only requires a storage space of 16*(N−1) bits, less than a storage space of L*(N−1) bits of the HDA stopping method, thereby reducing hardware.

Further, embodiments of the present invention can obtain the same superior performance as the conventional HDA scheme.

Although a number of exemplary embodiments of the present invention have been disclosed for illustrative purposes, those skilled in the art will appreciate that various modifications, additions, and substitutions are possible, without departing from the scope of the present invention.

What is claimed is:

1. An apparatus for stopping iterative decoding in a mobile communication system, comprising:
    a first constituent decoder for performing first constituent decoding of received signals and outputting a first constituent decoding result;
    a second constituent decoder for performing second constituent decoding of the received signals and outputting a second constituent decoding result;
    a first hard decision section for performing a first hard decision process for outputs of the first constituent decoder and outputting a first hard decision result;
    a second hard decision section for performing a second hard decision process for outputs of the second constituent decoder and outputting a second hard decision result;
    a first cyclic redundancy check (CRC) encoder for first CRC encoding outputs of the first hard decision section and outputting a first CRC encoding result;
    a second CRC encoder for second CRC encoding outputs of the second hard decision section and outputting a second CRC encoding result; and
    a stop condition determination section for checking a number of constituent decoding processes included in the first and the second CRC encoding results, and determining whether to stop iterative decoding according to whether the number of constituent decoding processes has reached a maximum number.

2. The apparatus of claim 1, wherein the stop condition determination section stops the iterative decoding when the number of constituent decoding processes reaches the maximum number.

3. The apparatus of claim 1, further comprising:
    a first interleaver, connected between the first constituent decoder and the second constituent decoder, for interleaving a sequence of data such that symbols output from the first constituent decoder are proper as an input of the second constituent decoder and outputting first interleaved data;
    a second interleaver, connected between the second hard decision section and the second CRC encoder, for interleaving a sequence of data such that symbols output from the second hard decision section are proper as an input of the second CRC encoder and outputting second interleaved data.

4. The apparatus of claim 1, wherein the stop condition determination section comprises:
    a memory for storing the first CRC encoding result and the second CRC encoding result.

5. The apparatus of claim 1, wherein the stop condition determination section determines whether the number of constituent decoding processes is less than a number of iterative decoding processes when the number of constituent decoding processes has not reached the maximum number, and determines whether to stop the iterative decoding according to whether the first and second CRC encoding results and CRC encoding results according to previous iterative decoding processes are substantially identical when the number of constituent decoding processes is equal to or greater than the number of iterative decoding processes.

6. The apparatus of claim 5, wherein the stop condition determination section stops the iterative decoding when the first and second CRC encoding results and the CRC encoding results according to the previous iterative decoding processes are substantially identical.

7. The apparatus of claim 5, wherein the stop condition determination section continuously performs the iterative decoding when the first and second CRC encoding results and the CRC encoding results according to the previous iterative decoding processes are not substantially identical.

8. A method for stopping iterative decoding in a mobile communication system, comprising:
   performing first constituent decoding of received signals and outputting a first decoded signal;
   performing second constituent decoding of the received signals and outputting a second decoded signal;
   performing a first hard decision process for the first decoded signal and outputting a first hard-decided signal;
   performing a second hard decision process for the second decoded signal and outputting a second hard-decided signal;
   first cyclic redundancy check (CRC) encoding the first hard-decided signal and outputting a first CRC encoding result;
   second CRC encoding the second hard-decided signal and outputting a second CRC encoding result;
   checking a number of constituent decoding processes included in the first CRC encoding result and the second CRC encoding result; and
   determining whether to stop iterative decoding according to whether the number of constituent decoding processes has reached a maximum number.

9. The method of claim 8, wherein the step of determining whether to stop iterative decoding comprises:
   stopping the iterative decoding when the number of constituent decoding processes reaches the maximum number.

10. The method of claim 8, wherein the step of determining whether to stop iterative decoding comprises:
   determining whether the number of constituent decoding processes is less than a number of iterative decoding processes when the number of constituent decoding processes has not reached the maximum number; and
   determining whether to stop the iterative decoding according to whether the first and second CRC encoding results and CRC encoding results according to previous iterative decoding processes are substantially identical when the number of constituent decoding processes is equal to or greater than the number of iterative decoding processes.

11. The method of claim 10, wherein the step of determining whether to stop the iterative decoding according to whether the first and second CRC encoding results and the CRC encoding results according to the previous iterative decoding processes are substantially identical comprises:
   stopping the iterative decoding when the first and the second CRC encoding results and the CRC encoding results according to the previous iterative decoding processes are substantially identical.

12. The method of claim 10, further comprising:
   continuously performing the iterative decoding when the first and second CRC encoding results and the CRC encoding results according to the previous iterative decoding processes are not substantially identical.

13. A method for stopping iterative decoding in a mobile communication system, comprising:
   performing constituent decoding of received signals and outputting decoded signals;
   performing hard decision processes for the decoded signals and outputting hard-decided signals;
   cyclic redundancy check (CRC) encoding the hard-decided signals and outputting parities;
   determining whether the number of constituent decoding processes is even; and
   determining whether the parities are identical when the number of constituent decoding processes is even and stopping iterative decoding according to a determination result.

14. The method of claim 13, further comprising:
   stopping the iterative decoding if the parities are identical.

15. The method of claim 13, further comprising:
   continuously performing the iterative decoding when the parities are not identical.

16. A method for stopping iterative decoding in a mobile communication system, comprising:
   performing constituent decoding of received signals and outputting decoded signals;
   performing hard decision processes for the decoded signals and outputting hard-decided signals;
   cyclic redundancy check (CRC) encoding the hard-decided signals and outputting parities;
   determining whether the number of constituent decoding processes is even; and
   determining whether the parities are identical when the number of constituent decoding processes is odd and stopping iterative decoding according to a determination result.

17. The method of claim 16, further comprising:
   stopping the iterative decoding if the parities are identical; and
   continuously performing the iterative decoding when the parities are not identical.

* * * * *